United States Patent
Kaitoh et al.

(10) Patent No.: US 7,524,685 B2
(45) Date of Patent: Apr. 28, 2009

(54) MANUFACTURING METHOD OF A DISPLAY DEVICE

(75) Inventors: Takuo Kaitoh, Mobara (JP); Eiji Oue, Mobara (JP); Toshihiko Itoga, Chiba (JP)

(73) Assignee: Hitachi Displays, Ltd., Mobara-shi (JP)

( * ) Notice: Subject to any disclaimer, the term of this patent is extended or adjusted under 35 U.S.C. 154(b) by 424 days.

(21) Appl. No.: 11/509,739

(22) Filed: Aug. 25, 2006

(65) Prior Publication Data

US 2007/0072349 A1 Mar. 29, 2007

(30) Foreign Application Priority Data

Sep. 27, 2005 (JP) ............................. 2005-279215

(51) Int. Cl.
*H01L 21/66* (2006.01)
(52) U.S. Cl. .................. 438/16; 716/4; 716/8; 438/168
(58) Field of Classification Search ...................... 716/4, 716/8; 438/16, 168
See application file for complete search history.

(56) References Cited

U.S. PATENT DOCUMENTS 6,756,614 B2 * 6/2004 Hatano et al. ............... 257/192
6,943,086 B2 9/2005 Hongo et al.
2004/0032979 A1 2/2004 Honda et al.

FOREIGN PATENT DOCUMENTS

JP 2002-222959 8/2002
JP 2003-124136 4/2003

* cited by examiner

*Primary Examiner*—Thanh V Pham
*Assistant Examiner*—Caleb Henry
(74) *Attorney, Agent, or Firm*—Antonelli, Terry, Stout & Kraus, LLP.

(57) ABSTRACT

The present invention provides a manufacturing method of a display device which can decrease the lowering of a yield rate of the display device attributed to the aggregations generated by pseudo single crystallization of a silicon film. A manufacturing method of a display device includes a semiconductor film reforming step which reforms a semiconductor film into a second state in which the semiconductor film possesses elongated crystalline particles by radiating a laser beam to the semiconductor film in a first state, an aggregation detecting step which detects the aggregation of the semiconductor film which is generated in the semiconductor film reforming step, and a defect determination step which determines a product as a defective product when a position of the aggregation is present in the inside of the predetermined region and determines the product as a good product when the position of the aggregation is present outside the predetermined region.

8 Claims, 16 Drawing Sheets

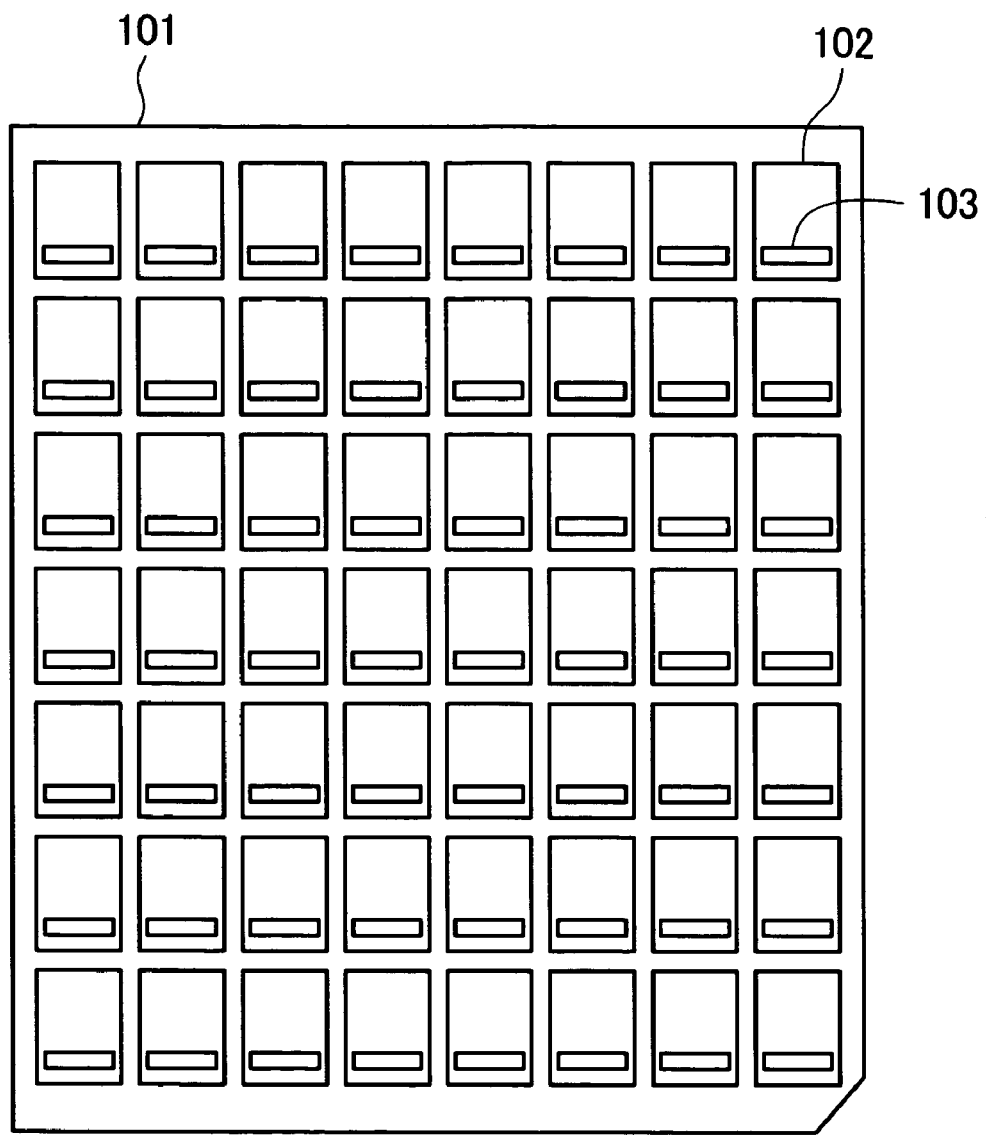

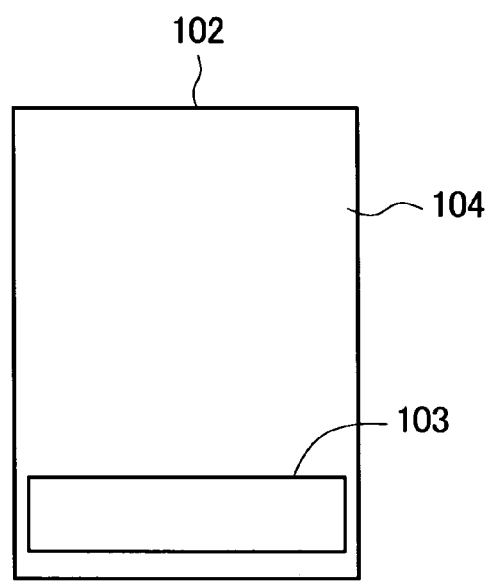
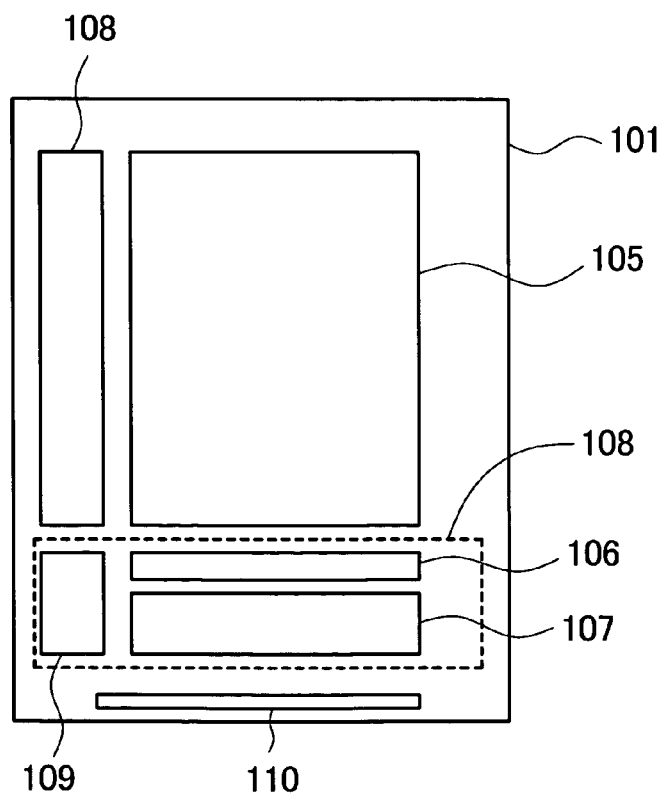

MANUFACTURING METHOD OF A DISPLAY DEVICE

The present application claims priority from Japanese application JP2005-279215 filed on Sep. 27, 2005, the content of which is hereby incorporated by reference into this application.

BACKGROUND OF THE INVENTION

1. Field of the Invention

The present invention relates to a manufacturing method of a display device which can prevent the lowering of a yield rate of a display device having a semiconductor film. The present invention relates more particularly to a manufacturing method of a display device which can prevent the lowering of a yield caused by a defect attributed to the aggregation which is generated in the pseudo single crystallization of a silicon film by a continuous oscillation laser.

2. Description of the Related Art

In a so-called flat-panel-type display device such as a liquid crystal display panel or an organic EL panel, to build in a larger number of peripheral circuits including drive circuits on a substrate which constitutes the panel in addition to pixel circuits of a display region, the development of a high-performance low-temperature poly-silicon thin film transistor (poly-SiTFT (LTPS-TFT)) has been under way. The manufacture of the high-performance low-temperature poly-silicon thin film transistor requires the improvement of the crystallinity of a silicon film, and there has been studied a technique which can make a particle size of the silicon film large (pseudo single crystallization) compared to the crystallization performed using conventional excimer laser annealing (ELA).

As one of techniques for improving the crystallinity, there has been known a method which selectively grows crystals in the specific direction by radiating solid laser beams of continuous oscillation to a silicon film which is formed on a substrate surface by a CVD or the like (hereinafter referred to as SELAX) The selective pseudo single crystallization method referred to as SELAX is disclosed in JP-A-2002-222959 (patent document 1) and JP-A-2003-124136 (patent document 2).

SUMMARY OF THE INVENTION

However, SELAX requires a longer melting time of a silicon (Si) film compared to the conventional pulse laser radiation and hence, a phenomenon "aggregation" in which the melted Si is partially gathered is generated thus giving rise to a case that the silicon film which is uniform in plane in a predetermined region on a substrate surface cannot be obtained. This aggregation is the phenomenon in which the silicon film is gathered at certain regions and portions having the silicon film and portions having no silicon film are present in mixture. As a cause of the aggregation, foreign substances or flaws in the silicon film, the quality of a CVD film, surface irregularities of a background or the like is considered.

When an active element of a thin film transistor or the like is formed using the region where such an Si film is aggregated as an active layer (a channel region or the like of the thin film transistor), an operation of the active element becomes defective and hence, a panel per se becomes defective thus giving rise to the lowering of a yield rate.

Conventionally, an inspection of the presence or the non-presence of such aggregation is performed by the observation with naked eyes using a projector or the observation using a microscope. Accordingly, to inspect all regions which are radiated with solid laser beams, a considerable amount of time is necessary and hence, it is substantially impossible to perform the total inspection.

Further, when a position where the aggregation occurs is a place other than an effective region (a position where the TFT is arranged or the like), the aggregation is removed by the photo etching step which is a next step and hence, the panel does not become defective. However, in the method which selects a good product and a defective product based on only the presence or the non-presence of the generation of aggregation, even when the aggregation which is present outside the effective region and is not originally treated as defective is found, the panel having such aggregation is determined as a defective product thus lowering a yield rate of a display device.

It is an advantage of the present invention to provide a manufacturing method of a display device which decreases the lowering of a yield rate of a display device attributed to the aggregation which is generated by the pseudo single crystallization of a silicon film using a continuous oscillation laser.

The above-mentioned advantage can be achieved by determining a product defective when the position of the aggregation is present within a predetermined region (for example, a region where an active element is formed or a region where a capacitance is formed) and by determining the product good when the position of the aggregation is present outside the predetermined region.

The present invention performs the selection of the defective product and the good product by determining the presence or the non-presence of the aggregation within the predetermined region simultaneously with the crystallization by the SELAX. Since the depletion of poly-silicon film attributed to the aggregation is found at the portion where the aggregation is generated, following aggregation determination methods are considered. That is, in one determining method, the difference in transmissivity which is measured using a transmitting light from a back surface of a panel or the like is imaged using a camera, a photo sensor or the like, and the presence or the non-presence of the aggregation is determined, while in another aggregation determination method, an image of the difference in reflectance is acquired using a camera, a photo sensor or the like, and the presence or the non-presence of the aggregation is determined based on the image recognition.

Simultaneously with the determination of the presence or the non-presence of the aggregation by the above-mentioned method, coordinates of the portions where the aggregation is present are recorded. The aggregation generation coordinates can be recorded based on the positional relationship between scanning coordinates of a solid laser and a detection mechanism (a camera, a photo sensor or the like).

On the other hand, map data of a photomask which is used in a photolithography process for defining an effective region in which peripheral circuits are build on a substrate which constitutes a panel is prepared as a table. Then, the recorded aggregation generation coordinates and the mask data are collated with each other, and a product is selected as a defective product only when the aggregation is present within the effective region of the poly-silicon film. The present invention is not limited to the peripheral circuits and maybe applicable to pixel circuits. Further, the present invention is not limited to the region where the active element is formed but also is applicable to a region where a capacitance is formed. Further, the present invention is applicable to the combination of these regions.

To enumerate the specific constitutions of the present invention, they are as follows, for example.

(1) A manufacturing method of a display device includes:
a semiconductor film reforming step which reforms a semiconductor film into a second state in which the semiconductor film possesses elongated crystalline particles by radiating a laser beam to the semiconductor film in a first state;
an aggregation detecting step which detects the aggregation of the semiconductor film which is generated in the semiconductor film reforming step; and
a defect determination step which determines a product as a defective product when a position of the aggregation is present in the inside of the predetermined region and determines the product as a good product when the position of the aggregation is present outside the predetermined region.

(2) In the constitution (1), the predetermined region includes, in patterning the semiconductor film in the second state, a region where the semiconductor film in the second state remains.

(3) In the constitution (1) or (2), the predetermined region includes a region where a thin film transistor using the semiconductor film in the second state is formed.

(4) In any one of the constitutions (1) to (3), the predetermined region includes a region where a channel region of a thin film transistor which uses the semiconductor film in the second state is formed.

(5) In any one of the constitutions (1) to (4), the predetermined region includes, out of a source region and a drain region of a thin film transistor which uses the semiconductor film in the second state, the region in which a contact hole is formed.

(6) In any one of the constitutions (1) to (5), the predetermined region includes a region in which a capacitance using the semiconductor film in the second state is formed.

(7) In any one of the constitutions (1) to (6), the predetermined region is calculated based on data of one to a plurality of photo masks.

(8) In any one of the constitutions (1) to (7), the aggregation detecting step detects the presence of the aggregation based on a quantity of light which passes through the semiconductor film.

Due to the present invention, all aggregations generated in the silicon film can be inspected thus preventing the transfer of the defective panel to a next step. Further, by selecting the defect which occurs in the crystallizing step at a point of time that the crystallization is completed, wasteful operations are eliminated with respect to succeeding operations up to a completion step. The generation of aggregation does not directly lead to the defective product, and regions other than the effective region (the region which is left as a portion where at least channels of an active element is formed) are removed by an etching step in a process such as the formation of islands made of a poly-silicon film and hence, in the crystallizing step, it is unnecessary to take the aggregations which are generated at portions other than the effective region in the crystallizing step into consideration.

The selection is performed by collating the mask data and the aggregation generating coordinates and hence, it is possible to set a selection standard for every substrate. Accordingly, by applying the substrate which is determined to have an aggregation defect with respect to a certain product to a product in which the same substrate is not determined to have the defective aggregation, it is possible to remedy or recover the substrate.

Further, with respect to the defective substrate, since the substrate is not transported to an inspection step and a liquid crystal step (a module assembling operation), it is possible to realize the shortening of an operation time and the reduction of the number of members used.

Further, the present invention is not limited to the manufacture of the liquid crystal display device or other flat-panel-type display devices which use low-temperature poly silicon (LTPS) TFT but also is applicable to display devices similar to these display devices or the manufacture of the semiconductor chips.

BRIEF DESCRIPTION OF THE DRAWINGS

FIG. 1 is a plan view of a mother substrate in which a large number of substrates which constitute panels of display devices are built;

FIG. 2 is a plan view for explaining individual substrate formed on the mother substrate;

FIG. 3 is a plan view for explaining respective functional regions in which a TFT is arranged on a surface of a glass substrate which forms TFTs using a pseudo single crystal silicon film;

DESCRIPTION OF THE PREFERRED EMBODIMENTS

Figure 4A:
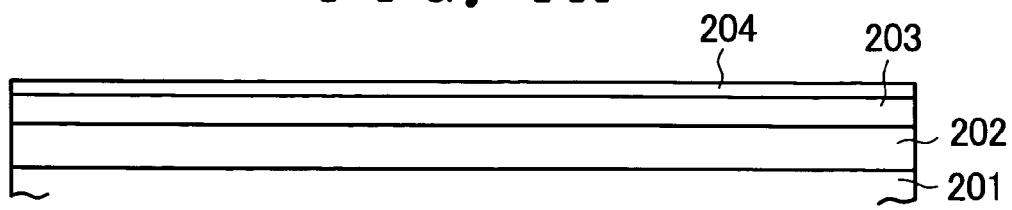
FIG. 4A to FIG. 4D are step views for explaining a manufacturing process of an n-MOS top gate TFT.

Hereinafter, preferred embodiments of the present invention are explained in detail in conjunction with drawings which show the embodiments.

FIG. 1 is a plan view of a mother substrate in which a large number of substrates which constitute panels of display devices are built. Here, the substrate is explained as a substrate in which a low-temperature poly silicon (LTPS) TFT is built. The individual substrate may be also referred to as a chip. The mother substrate (substrate) 101 is formed of a glass substrate. A plurality of substrates 102 which constitute the panels are arranged longitudinally and laterally on the glass substrate 101. Numeral 103 indicates a pseudo single crystallized silicon region.

Further, FIG. 2 is a plan view for explaining individual substrate formed on the mother substrate. On the glass substrate 102, a poly-crystalline silicon region 104 which is formed using an excimer laser or the like and a pseudo single crystallized silicon region (pseudo single crystallized region) 103 which is crystallized using a continuous oscillation solid laser are present.

FIG. 3 is a plan view for explaining respective functional regions which are arranged on a surface of a glass substrate on which TFTs are formed using a pseudo single crystal silicon film. In FIG. 3, on the glass substrate 101, a pixel part 105, a data driver (a signal line selecting circuit part 106, a horizontal scanning circuit part 107), a gate driver (a vertical scanning circuit part 108), a booster circuit and an input signal processing circuit part 109 are arranged. Here, an input pad part 110 constitutes a terminal which is connected to an external power source and signal lines. Depending on the constitutions of the respective circuit parts which are arranged on the glass substrate 101, the required device characteristics are determined. The high performance device which uses the pseudo single crystal adopts a high-speed operation circuit part (the signal line selecting circuit part 106, the horizontal scanning circuit part 107, the booster circuit and the input signal processing circuit part 109). Portions other than the high-speed operation circuit part constitute a poly-crystalline silicon region. In this manner, the process which selectively applies the pseudo single crystallization to only the required region is adopted.

FIG. 4A to FIG. 4D, FIG. 5A to FIG. 5D, FIG. 6A to FIG. 6D, FIG. 7A to FIG. 7D, FIG. 8A to FIG. 8C, FIG. 9A to FIG. 9B and FIG. 10 are step views for explaining the manufacturing process of an n-MOS top gate TFT. This process is explained in order of FIG. 4A to FIG. 4D, FIG. 5A to FIG. 5D, FIG. 6A to FIG. 6D, FIG. 7A to FIG. 7D, FIG. 8A to FIG. 8C, FIG. 9A to FIG. 9B and FIG. 10.

FIG. 4A: A silicon nitride (SiN) film 202, a silicon oxide ($SiO_2$) film 203, an amorphous silicon film 204 are formed on a glass substrate 201 by a plasma CVD method. Hydrogen contained in the amorphous silicon film 204 is removed by heat treatment.

Figure 4B:
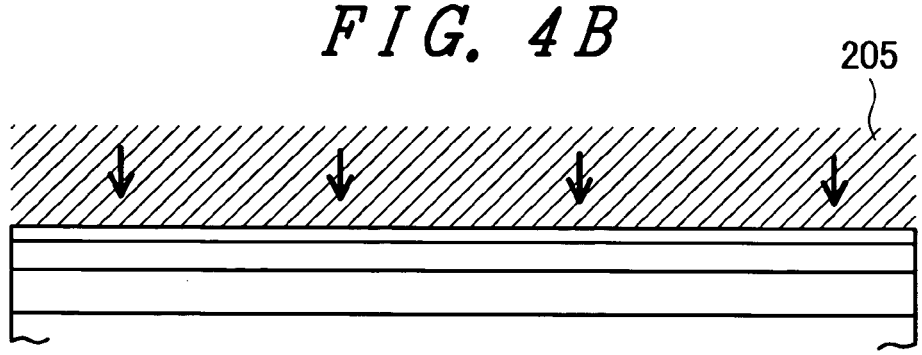

FIG. 4B: Excimer laser beams 205 are radiated to the amorphous silicon film 204 to poly-crystallize the amorphous silicon into.

Figure 4C:
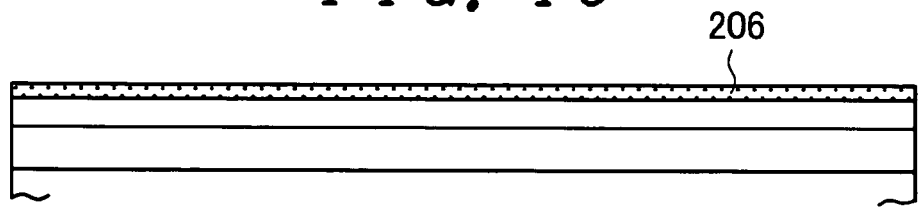

FIG. 4C: A poly-crystalline silicon film 206 is completed.

Figure 4D:
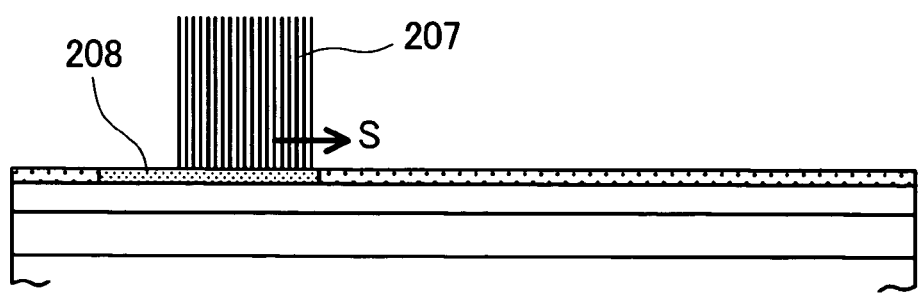

FIG. 4D: By radiating laser beams to the poly crystalline silicon film 206 using a continuous oscillation laser 207 or the like by scanning thus annealing the poly crystalline silicon film 206, the poly-crystalline silicon film 206 is reformed into a silicon film which is pseudo-single-crystallized (a pseudo single crystallized silicon film 208). The scanning direction is indicated by an arrow S. Here, the scanning by the laser in this specification implies the relative movement of the positional relationship between a spot of laser beams and the conductor film, wherein the scanning includes a case in which the substrate is moved, a case in which the laser beams are moved, and a case in which both of the substrate and the laser beams are moved. It is desirable to use a solid laser as a continuous oscillation laser 207.

Figure 5A:
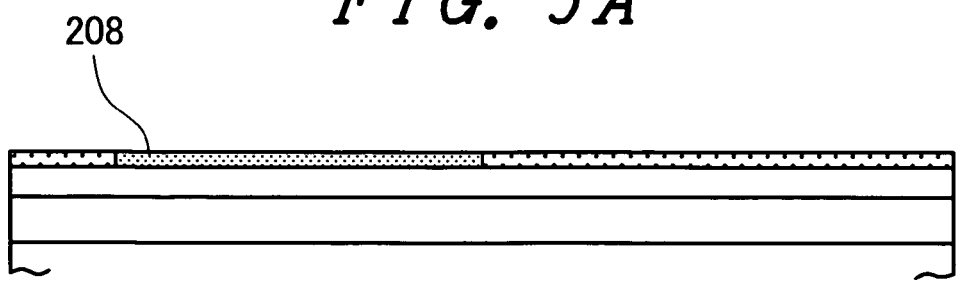
FIG. 5A to FIG. 5D are step views for explaining the manufacturing process of the n-MOS top gate TFT following the step shown in FIG. 4D.

FIG. 5A: A pseudo-single-crystallized silicon film 208 is formed in the desired region.

Figure 5B:
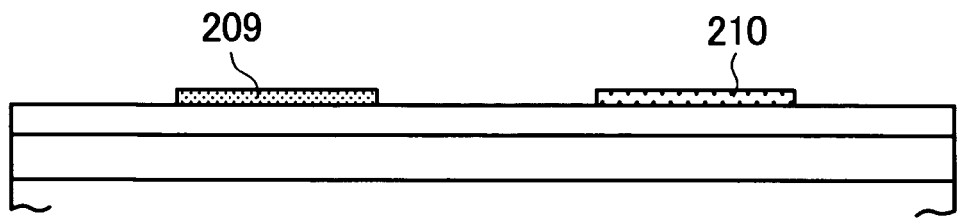

FIG. 5B: After finishing the pseudo single crystallization, the silicon film is formed into island-like silicon films 209, 210 by a photo etching step. The island-like silicon film 210 is used for forming a polycrystalline Si-TFT and the island-like silicon film 209 is used for forming a pseudo single crystalline Si-TFT.

Figure 5C:
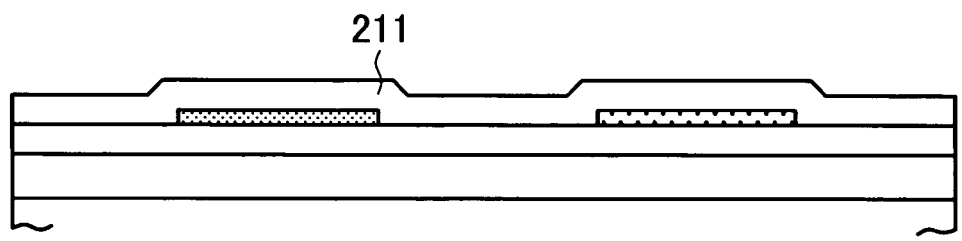

FIG. 5C: A gate insulation film ($SiO_2$) 211 is formed on the island-like silicon films 209, 210 which are formed by island-like forming by a plasma CVD method.

Figure 5D:
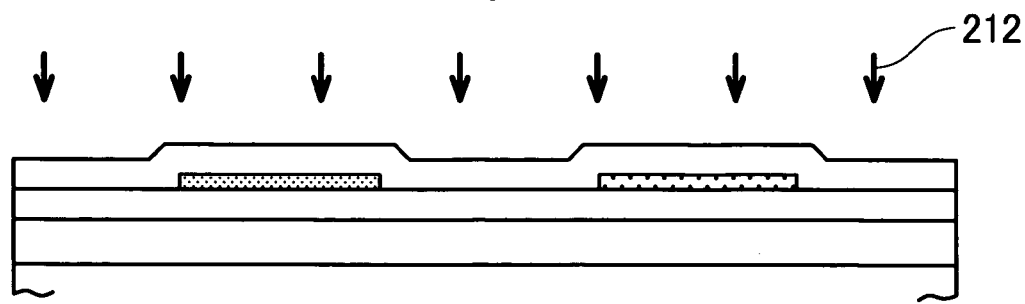

FIG. 5D: Ions 212 of low concentration (ion species being $B^+$ in general) are implanted for a $V_{th}$ control of the TFT.

Figure 6A:
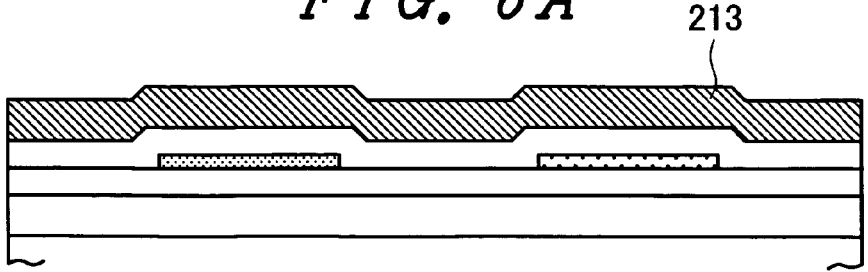
FIG. 6A to FIG. 6D are step views for explaining the manufacturing process of the n-MOS top gate TFT following the step shown in FIG. 5D.

FIG. 6A: A metal layer 213 which later constitutes gate lines and capacitance lines is formed.

Figure 6B:
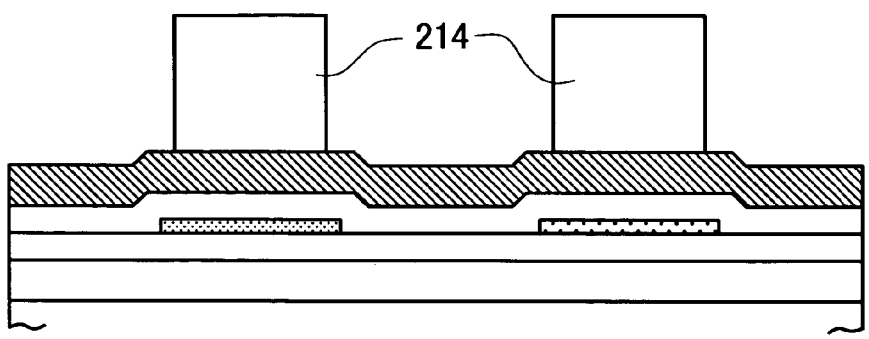

FIG. 6B: After applying a photo resist 214 to the metal layer 213 and drying the photo resist 214, the photo resist 214 is formed by a photo etching step.

Figure 6C:
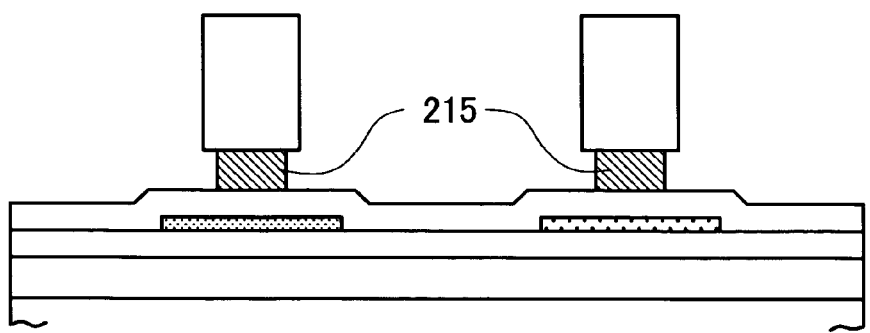

FIG. 6C: The metal layer 213 is formed by etching thus forming a gate electrode 215. Here, by performing side etching, a formed size of the gate electrode 215 is decreased compared to a formed size of the photo resist 214.

Figure 6D:
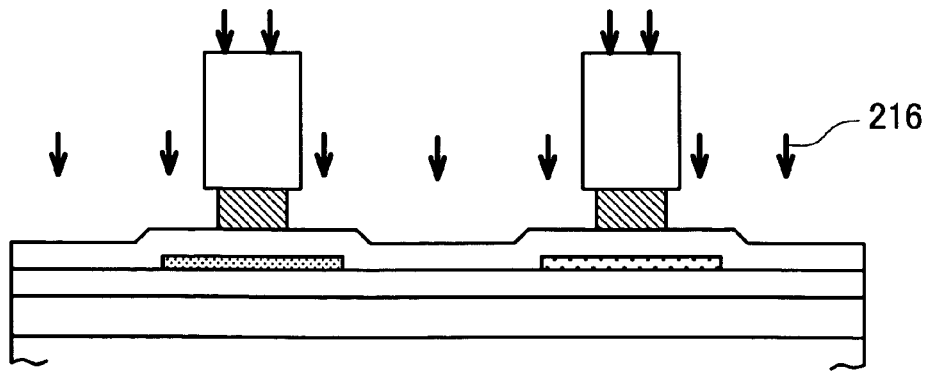

FIG. 6D: Ions are implanted into source and drain regions. Ions 216 are made of $P^+$.

Figure 7A:
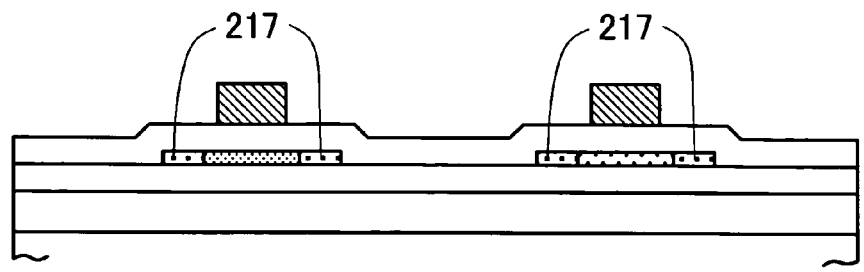
FIG. 7A to FIG. 7D are step views for explaining the manufacturing process of the n-MOS top gate TFT following the step shown in FIG. 6D.

FIG. 7A: The source and drain regions 217 are completed and the photo resist 214 is removed.

Figure 7B:
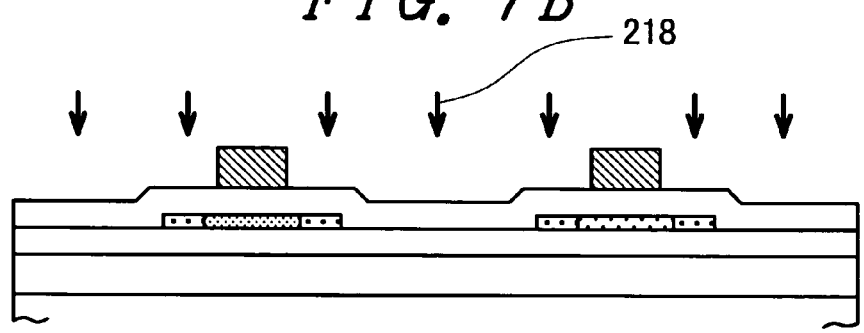

FIG. 7B: For forming an LDD (Lightly Doped Drain) region in the TFT, $P^+$ ions 218 having low concentration are implanted to the whole surface of the TFT using a gate electrode 215 as a mask.

Figure 7C:
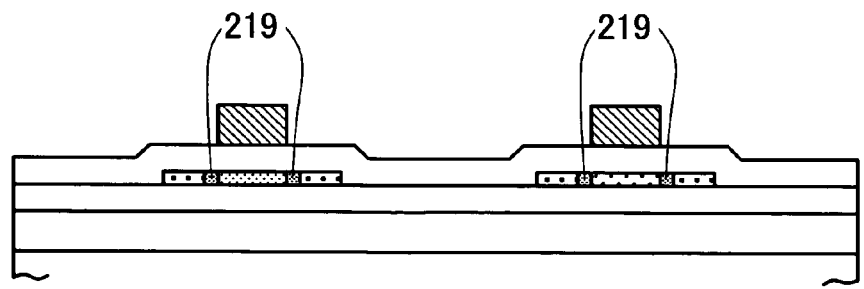

FIG. 7C: The LDD region 219 is formed.

Figure 7D:
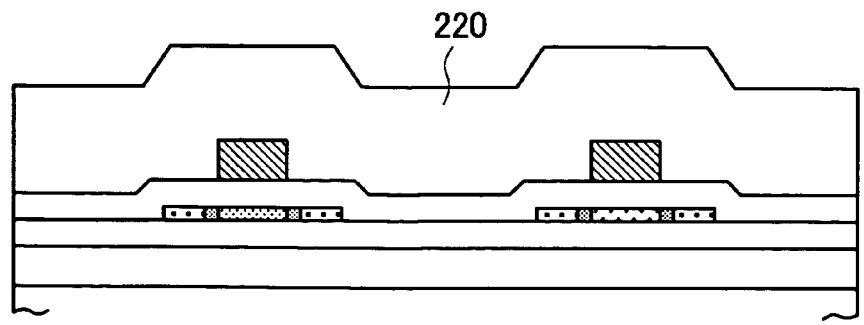

FIG. 7D: An interlayer insulation film 220 is formed. Annealing treatment is performed for activating the implanted impurity ions.

Figure 8A:
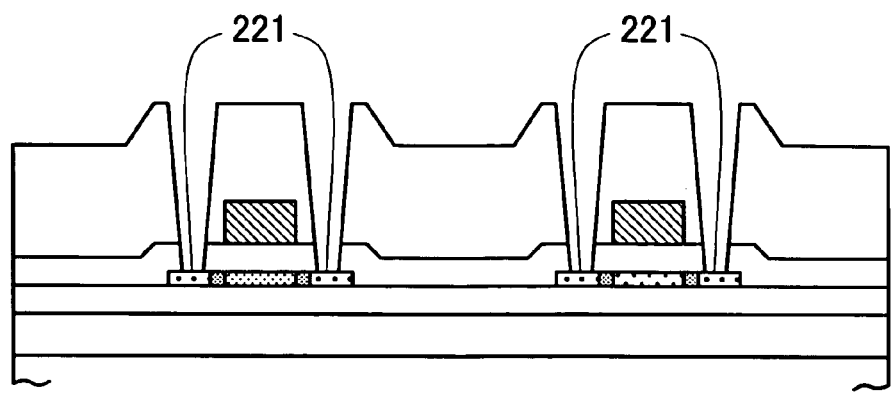
FIG. 8A to FIG. 8C are step views for explaining the manufacturing process of the n-MOS top gate TFT following the step shown in FIG. 7D.

FIG. 8A: Contact holes 221 for connection with the source and drain regions are formed by photo etching.

Figure 8B:
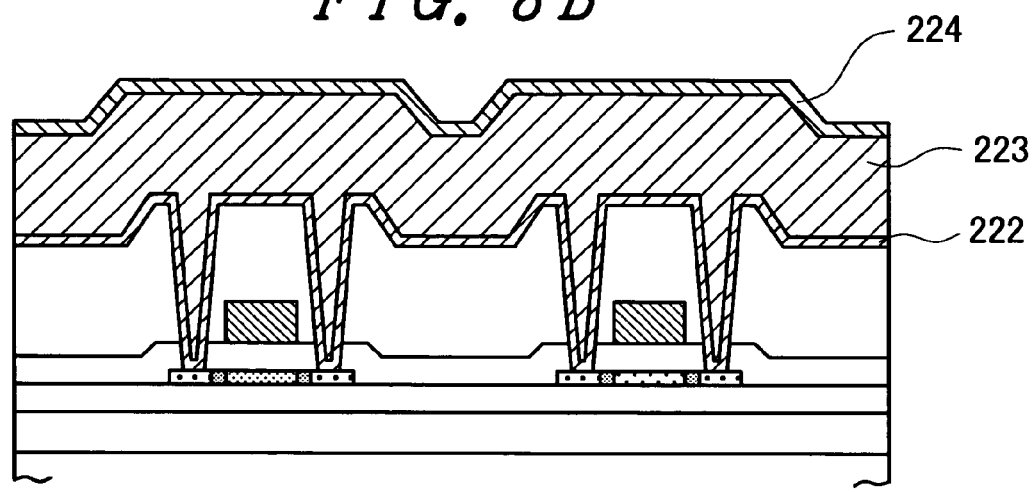

FIG. 8B: Source and drain lines (a barrier layer 222, an aluminum (Al) layer 223, a cap layer 224) are formed.

Figure 8C:
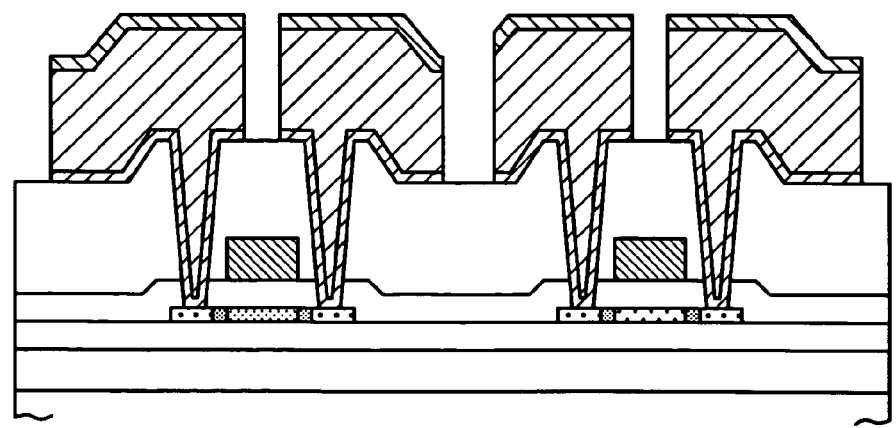

FIG. 8C: the source and drain lines (the barrier layer 222, the aluminum (Al) layer 223, the cap layer 224) are formed by a photo etching step thus separating the source and drain lines. Portions of the source and drain lines constitute source and drain electrodes.

Figure 9A:
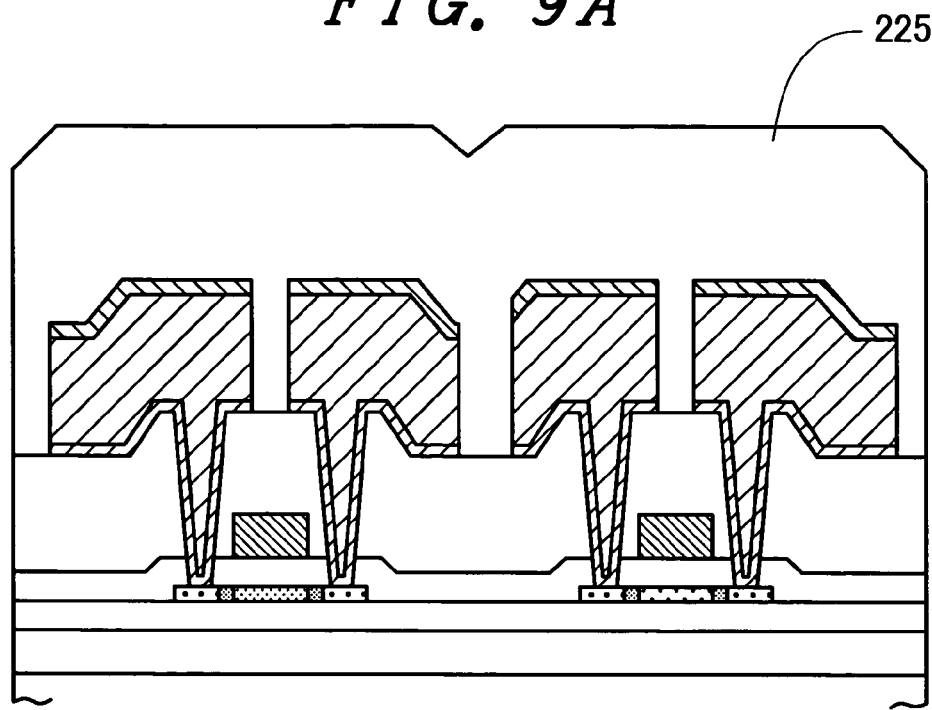
FIG. 9A to FIG. 9B are step views for explaining the manufacturing process of the n-MOS top gate TFT following the step shown in FIG. 8C.

FIG. 9A: A passivation film (insulation film) 225 is formed. The TFT is completed with terminal treatment.

Figure 9B:
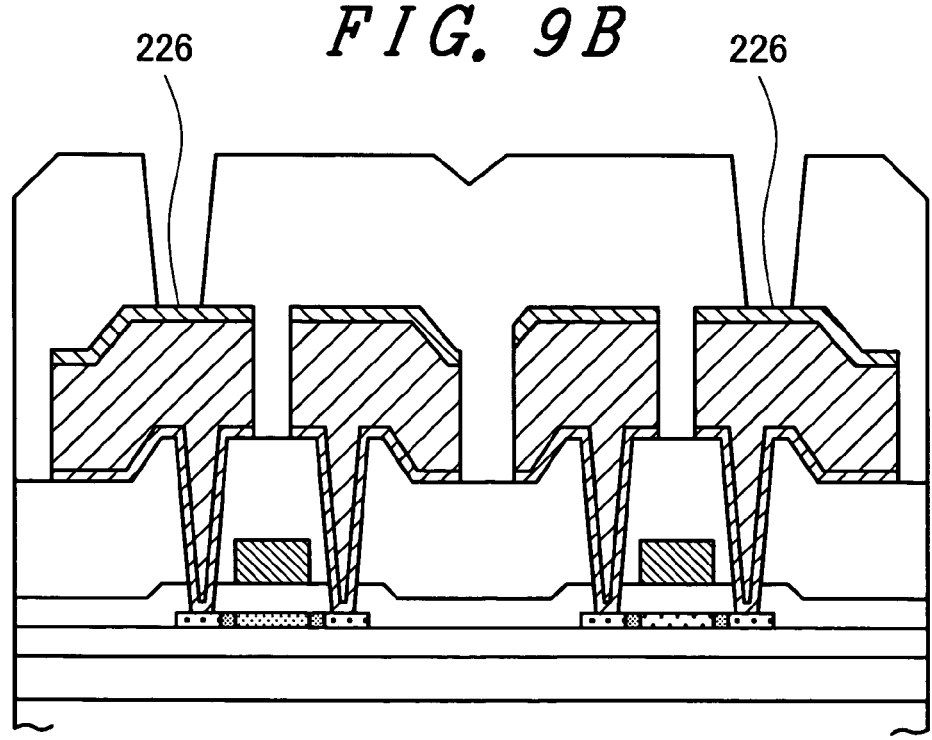

FIG. 9B: Opening portions for contact holes 226 which are connected with an ITO film which constitutes pixel electrodes (in case of a pixel portion) or lines (in case of a peripheral circuits) are formed by etching.

Figure 10:
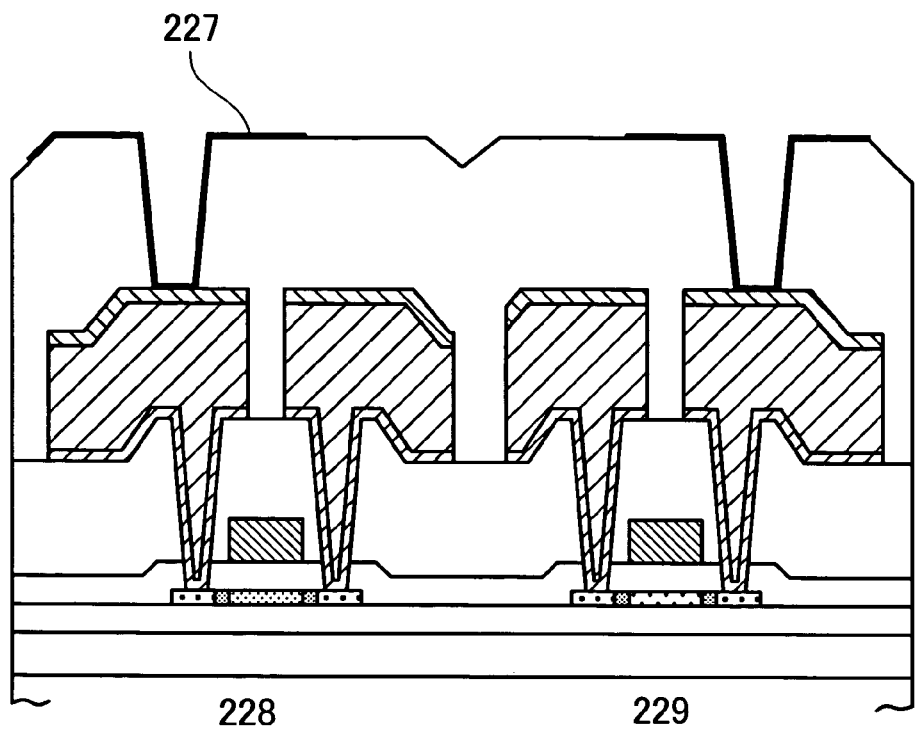
FIG. 10 is a step view for explaining the manufacturing process of the n-MOS top gate TFT following the step shown in FIG. 9B.

FIG. 10: An ITO film 227 is formed in a predetermined pattern. Accordingly, a substrate in which the thin film transistors (TFT) 228 using the pseudo single crystal silicon film and the thin film transistors (TFT) 229 which use the poly crystalline silicon film are built is completed.

Figure 11:
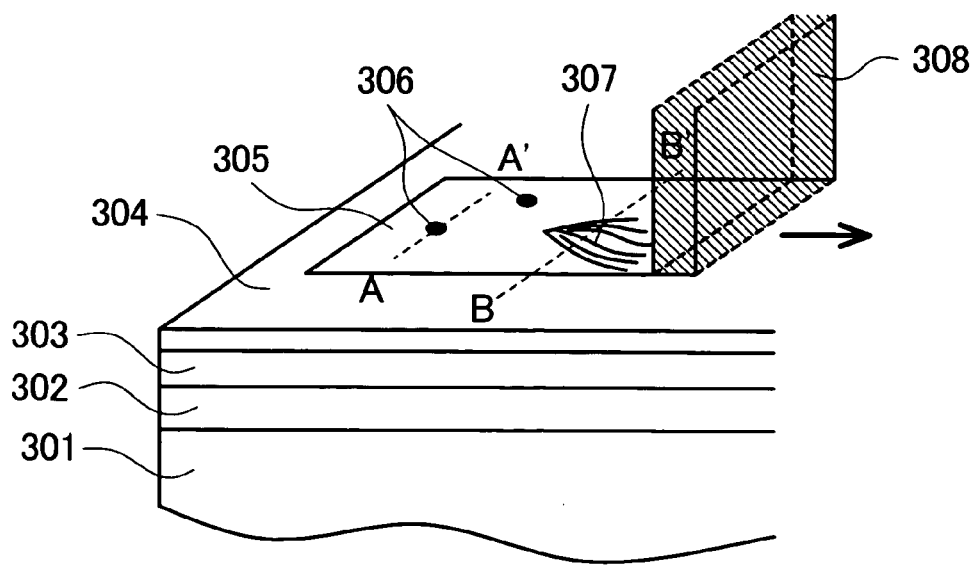
FIG. 11 is schematic view for explaining a pseudo single crystallizing treatment of a silicon film using a continuous oscillation laser.

FIG. 11 is schematic view for explaining the pseudo single crystallizing treatment of a silicon film using a continuous oscillation laser. In FIG. 11, to a specimen which includes an SiN film 302 and an $SiO_2$ film 303 which are formed by a plasma CVD method and a poly-silicon film (1) 304 in a first stage which is crystallized by the excimer laser beams on a glass substrate 301, laser beams are radiated by a continuous oscillation laser 308 to form the poly-silicon film (1) 304 in the first state to a poly-silicon film (2) 305 in the second state by the pseudo-single crystallization. The position of the region of the poly-silicon film (2) 305 differs for every product to which the present invention is applied, and a preset region with respect to the position of the substrate is selectively formed into a pseudo-single-crystallized state.

In the crystallizing step of the poly-silicon film (2) 305, the aggregations 306, 307 are generated. As the shape of the aggregation, the spot-like aggregation 306, the line-like aggregation 307 and the like are considered. The aggregations are generated attributed to foreign substances on the substrate and the silicon film, flaws formed on the substrate, an interface condition between the poly-silicon film and the $SiO_2$ film which constitutes a back ground film of the poly-silicon film, a melting time of the Si film at the time of crystallization by the continuous oscillation laser 308 or the like.

Figure 12:
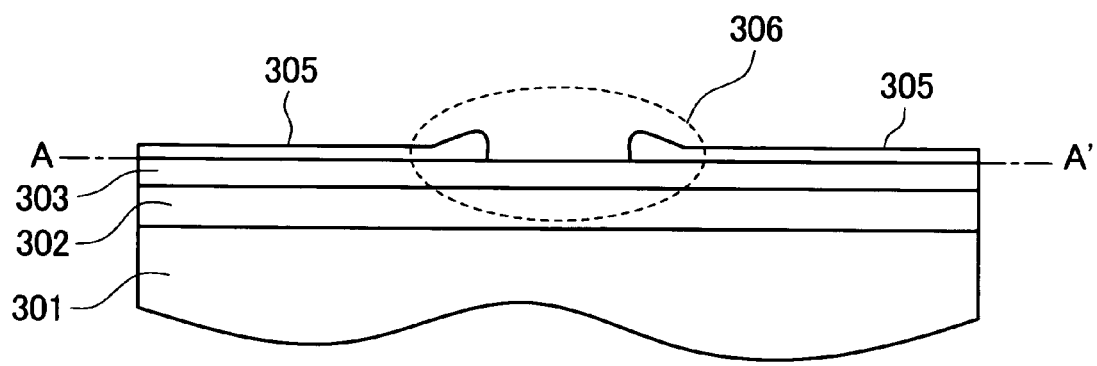
FIG. 12 is a cross-sectional view for explaining a shape of the spot-like aggregation.

FIG. 12 is a cross-sectional view for explaining a shape of the spot-like aggregation. This cross-section is a cross-section as viewed along the line A-A' direction in FIG. 11. The spot-like aggregation 306 is configured such that the poly-silicon film (2) 305 is eliminated thus forming a hole in a silicon film as surrounded by a broken line 306.

Figure 13:
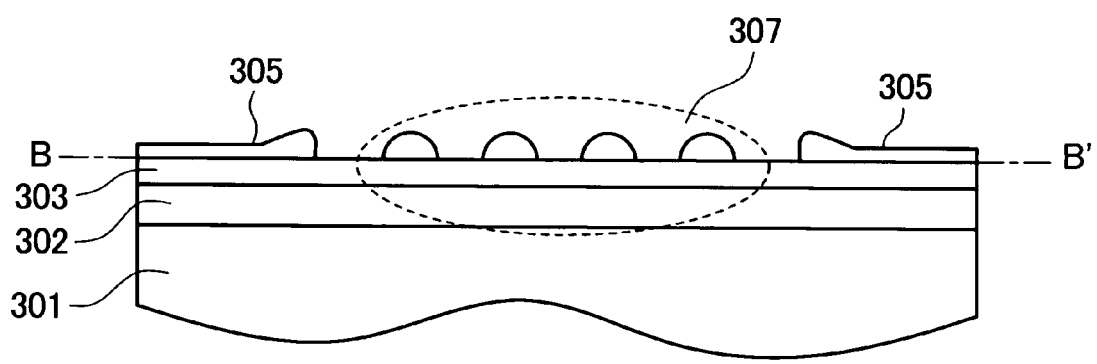
FIG. 13 is a cross-sectional view for explaining a shape of the line-like aggregation.

FIG. 13 is a cross-sectional view for explaining a shape of the line-like aggregation. The line-like aggregation 307 is configured such that the Si films are concentrated in a spaced apart manner. The cross-section is a cross-section as viewed in the line B-B' direction in FIG. 11, wherein the line-like aggregation 307 scatters silicon in a spaced apart manner as dots.

As shown in FIG. 12 and FIG. 13, the poly-silicon film is partially concentrated in the aggregation generating portion and hence, sections where the silicon films are gathered and sections where the silicon films are eliminated are formed.

Figure 14:
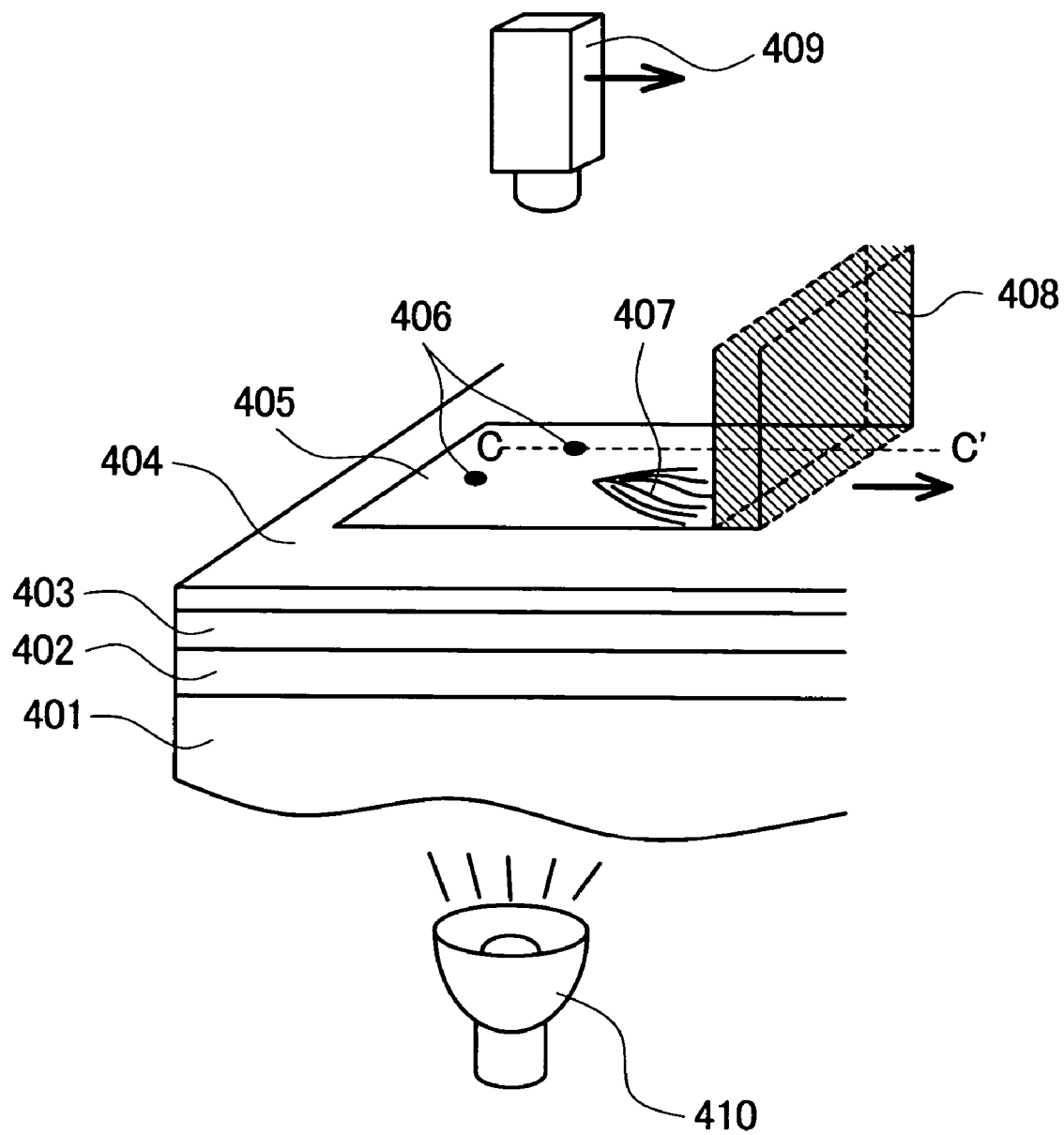
FIG. 14 is a conceptual view for explaining one example of an aggregation inspecting method in a pseudo single crystallizing treatment.

FIG. 14 is a conceptual view for explaining one example of an aggregation inspecting method in a pseudo single crystallizing step. In FIG. 14, to a specimen which includes an SiN film 402 and an $SiO_2$ film 403 which are formed by a plasma CVD method and a poly-silicon film (1) 404 in a first stage which is crystallized by the excimer laser beams on a glass substrate 401, laser beams are radiated by a continuous oscillation laser 408 to form a the poly-silicon film (1) 404 in the first state into a poly-silicon film (2) 405 in the second state. The poly-silicon film (1) 404 exhibits the granular crystal, while the poly-silicon film (2) exhibits the strip-like crystal having elongated crystal particles. The poly-silicon film (2) also has a strip-like crystal grain boundary. This is because that the crystals are selectively grown in the lateral direction which is the scanning direction of the laser.

In the poly-silicon film (2) 405, the aggregations 406, 407 are generated at the time of pseudo crystallization. In parallel with this crystallization, an incident light is radiated from a light source 410 which is arranged on a back surface of the glass substrate 401, and a change of the incident light is read by an optical sensor 409 which is arranged on a film surface side of the glass substrate 401. The optical sensor 409 is moved in the same manner as the scanning direction S of the continuous oscillation laser 408, and a change of the correlation between a change of light quantity and the ordinates of the substrate is taken. Further, by exchanging the optical sensor 409 with a camera or the like, it is also possible to read the aggregation positions from an image as pixel information.

Figure 15:
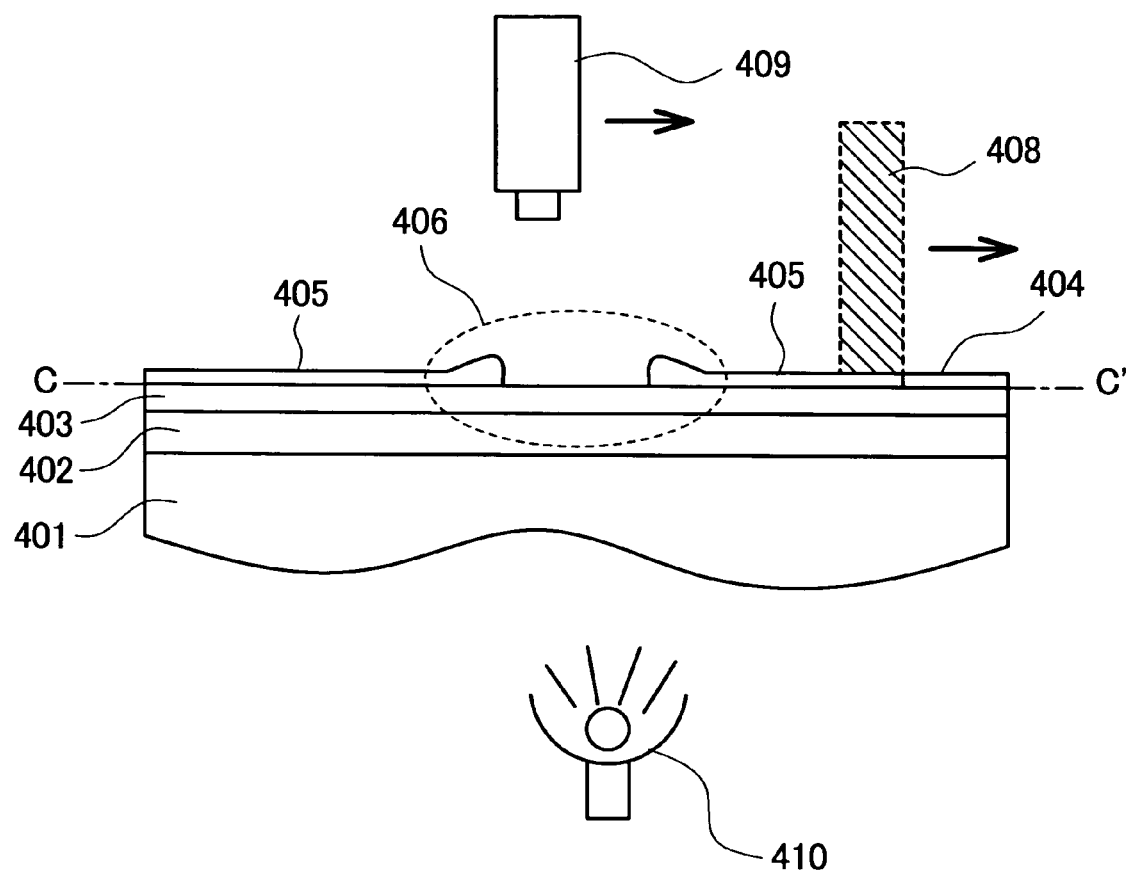
FIG. 15 is a schematic view showing a cross-section in FIG. 14 taken along a line C-C'.

FIG. 15 is a schematic view showing a cross-section in FIG. 14 taken along a line C-C'. In FIG. 15, light from the light source 410 is detected by the optical sensor 409 through the glass substrate 401. Since the silicon film 405 is not provided at the portion of the aggregation 406, the optical transmissivity is changed.

Figure 16:
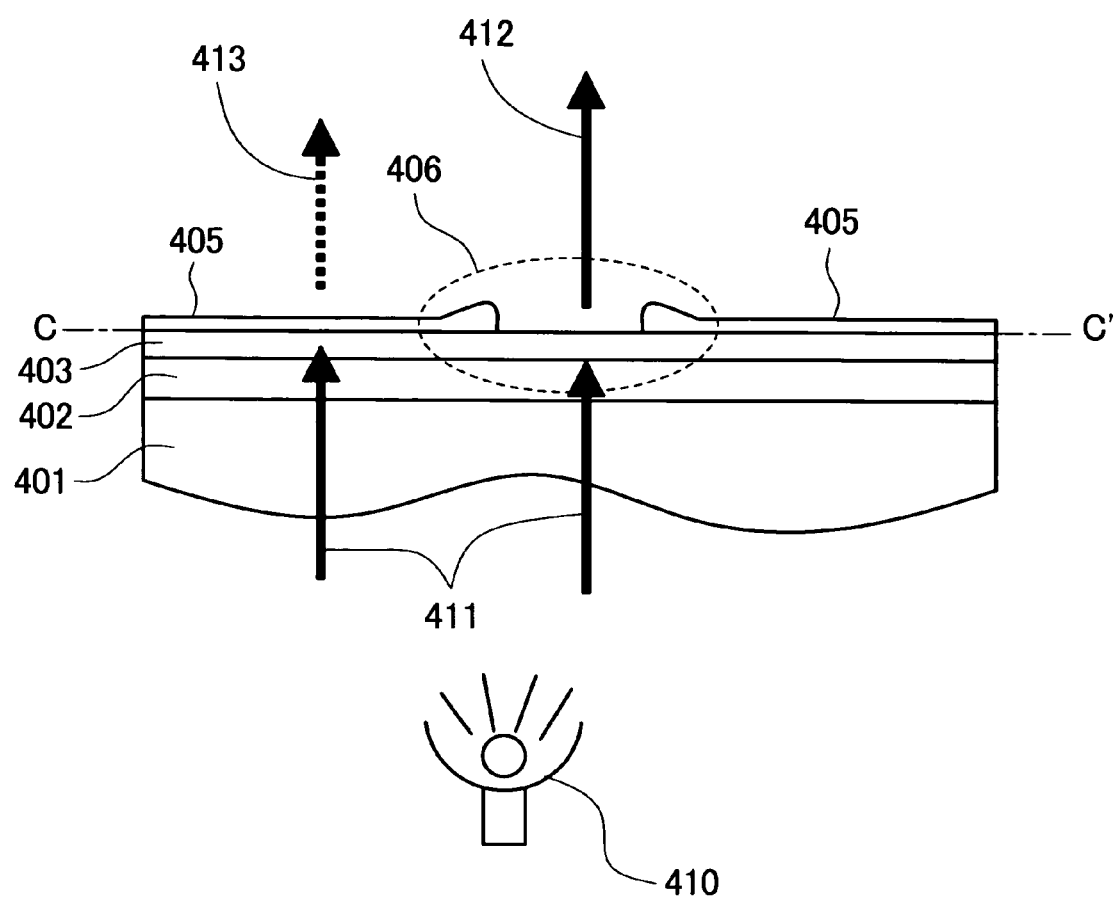
FIG. 16 is a schematic view similar to FIG. 15 for explaining a principle of the aggregation inspecting method.

FIG. 16 is a schematic view similar to FIG. 15 for explaining the principle of the aggregation inspecting method. In FIG. 16, when the incident light 411 passes through the glass substrate (to be more specific, the glass substrate 401, the SiN film 402, the $SiO_2$ film 403, the poly-silicon film 405), due to the absorption of light by the poly-silicon film 405, a light transmitting quantity 413 is decreased. In the aggregation portion 406, since there is no light absorption by the poly-silicon film 405, a light transmitting quantity 412 is larger than the light transmitting quantity 413. The aggregation portion is detected by making use of this difference in light transmitting quantity.

Figure 17:
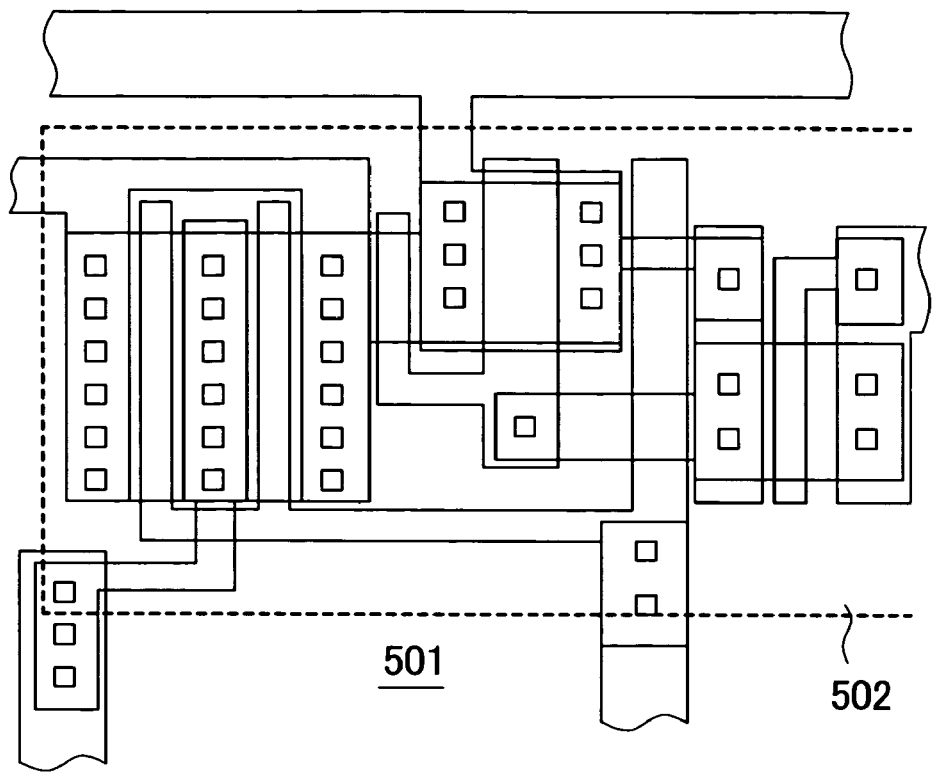
FIG. 17 is a partial plan view for explaining the arrangement of a silicon film and a TFT in a peripheral circuit portion of a glass substrate.
Figure 18:
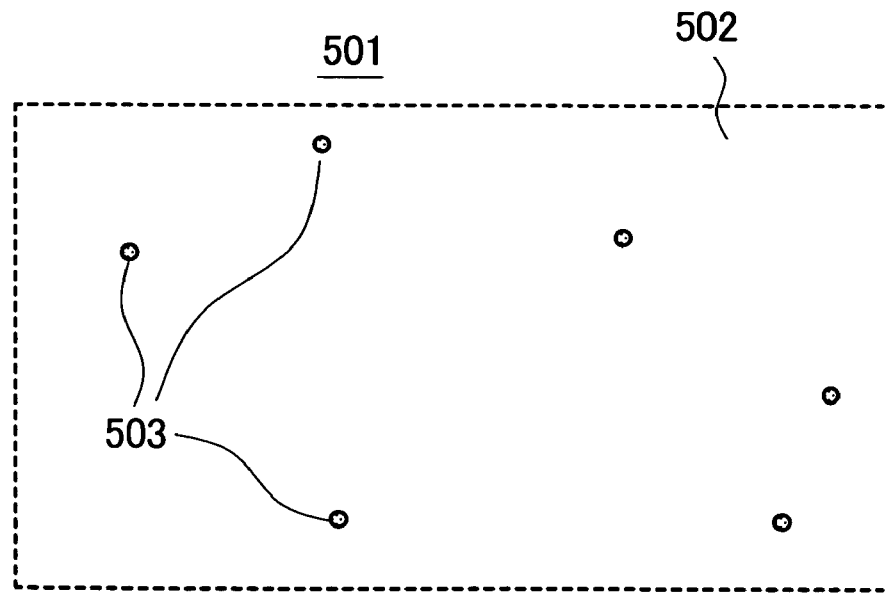
FIG. 18 is a partial plan view showing a pattern of the silicon film after the pseudo single crystallizing treatment.

FIG. 17 is a partial plan view for explaining the arrangement of a silicon film and a TFT in a peripheral circuit portion of a glass substrate. Further, FIG. 18 is a partial plan view showing a pattern of the silicon film after the pseudo single crystallizing treatment. In the inside of a poly-silicon film (1) 501 to which excimer laser annealing is applied, a poly-silicon film (2) 502 which is pseudo-single-crystallized by a solid laser or the like is arranged. In the inside of the poly-silicon film (2) 502, the aggregations 503 which are generated during a crystallizing step are present at random.

In the present invention, when the position of the aggregation is present within the predetermined region, a product is determined to be a defective product, while when the position of the aggregation is outside the predetermined region, the product is determined to be a good product. Here, it is desirable to perform this determination on the presence of defect before a step in which a poly-silicon film is patterned. The predetermined region can be calculated based on one or a plurality of photo mask data. For example, by taking a case in which TFTs are arranged as shown in FIG. 17 as an example, the manner of determining the defective product with respect to the region in which the aggregation is present is explained.

Figure 19:
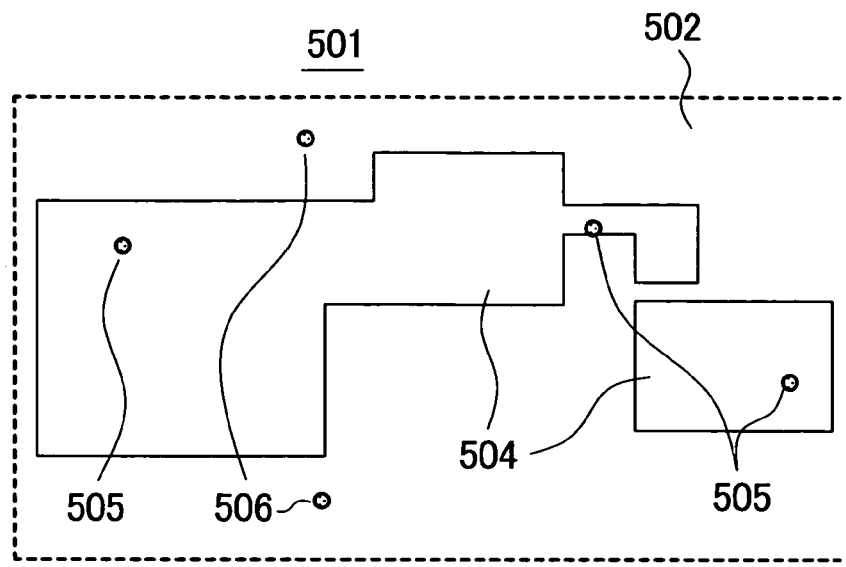
FIG. 19 is a partial plan view for explaining a state after patterning the poly-silicon film which is pseudo-single-crystallized as shown in FIG. 18.

FIG. 19 is a partial plan view for explaining a state after patterning the poly-silicon film which is pseudo-single-crystallized as shown in FIG. 18. When the poly-silicon film (2) 502 is formed by a photo etching step, the poly-silicon film (2) 502 remains only portions within the effective region 504.

Here, in FIG. 19, for explaining the determining method of the present invention and advantageous effects of the determining method, the aggregations are shown in a state that the aggregations are left intentionally. Here, assume the aggregations which are generated at portions within the effective region (region remaining after patterning) 504 as the aggregations (1) 505 and other aggregations as the aggregation (2) 506. Since the aggregations (2) 506 are removed by etching, the aggregations (2) 506 are not present on the substrate after forming the poly-silicon film. Accordingly, to prevent the aggregations from being arranged on the TFT forming region or to prevent the aggregations from remaining in the poly silicon after patterning, when the aggregations (1) 505 are present, the product is determined as a defective product, while when only the aggregations (2) 506 are present in the product, the product is determined as the good product.

Accordingly, compared to the case in which the product is determined to be the defective product even when one aggregation is present within the pseudo single crystallizing region, a rate that the product is determined to be the defective product is lowered and hence, it is possible to reduce the lowering of a yield rate. In this case, the predetermined region which is used for the determination of the defective product is a region where the semiconductor film remains after patterning. The predetermined region can be calculated based on data of the mask which is used for patterning.

Figure 20:
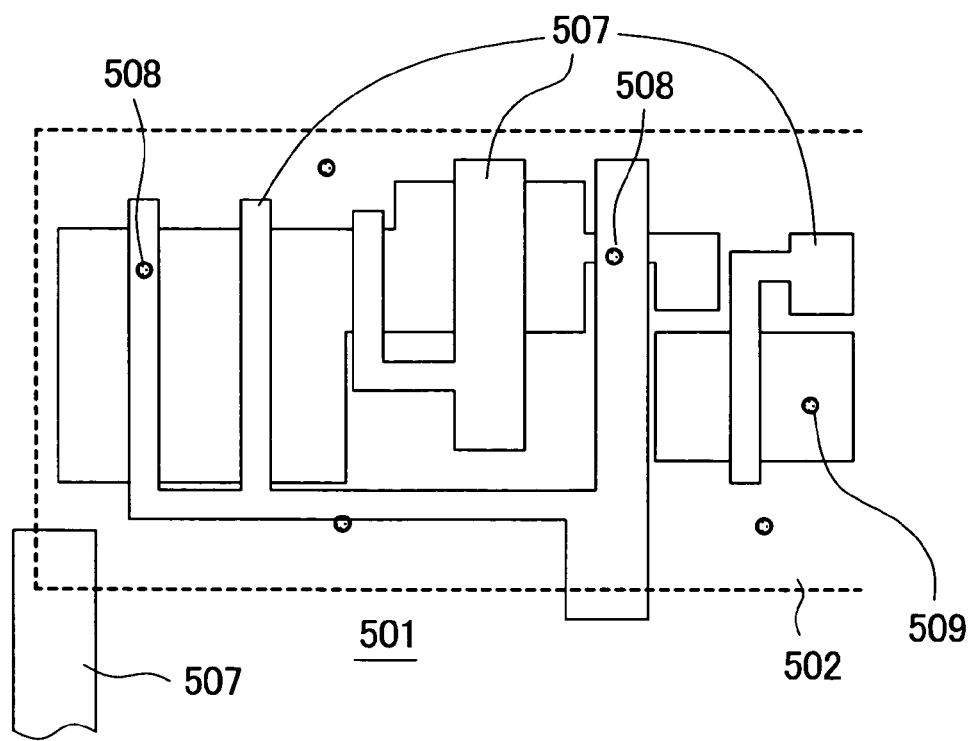
FIG. 20 is a partial plan view for explaining a state in which a gate electrode is formed on the poly-silicon film (2)

FIG. 20 is a partial plan view for explaining a state in which a gate electrode is formed on the poly-silicon film (2). The gate electrode 507 is formed on the effective region 504 which remains after patterning out of the poly-silicon film (2) 502 by way of an insulating film. Here, with respect to the aggregations (1) 505 which remain after patterning the poly-silicon film, the aggregations which are positioned at portions which are overlapped to the gate electrode 507 (that is, channel regions of a TFT) are referred to as aggregations (1-a) 508, while the aggregations which are positioned at portions which are not overlapped to the gate electrode 507 (that is, the portions which are positioned outside the channel region) are referred to as aggregations (1-b) 509.

Figure 21:
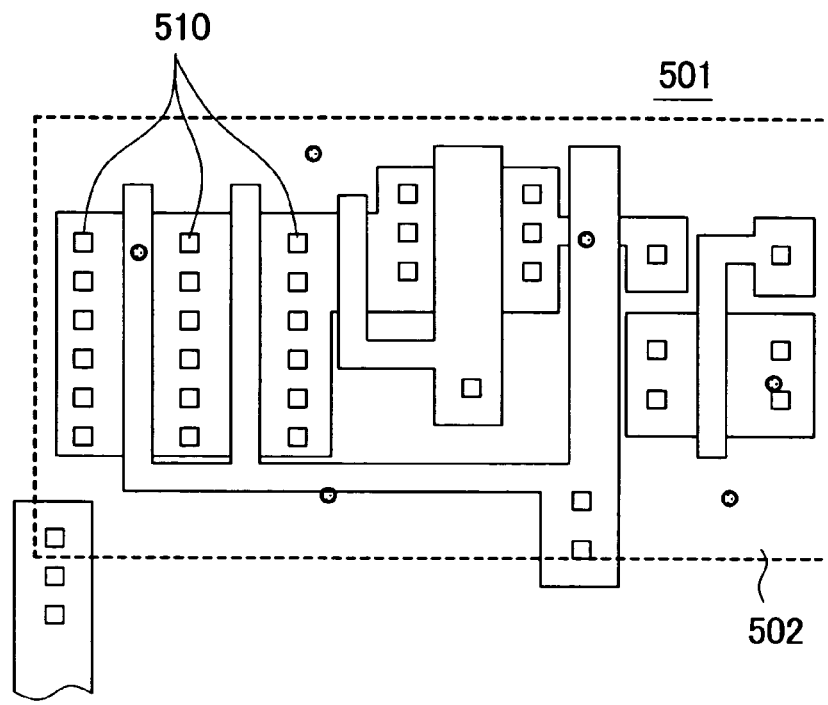
FIG. 21 is a partial plan view showing a state in which a contact hole is formed.
Figure 22:
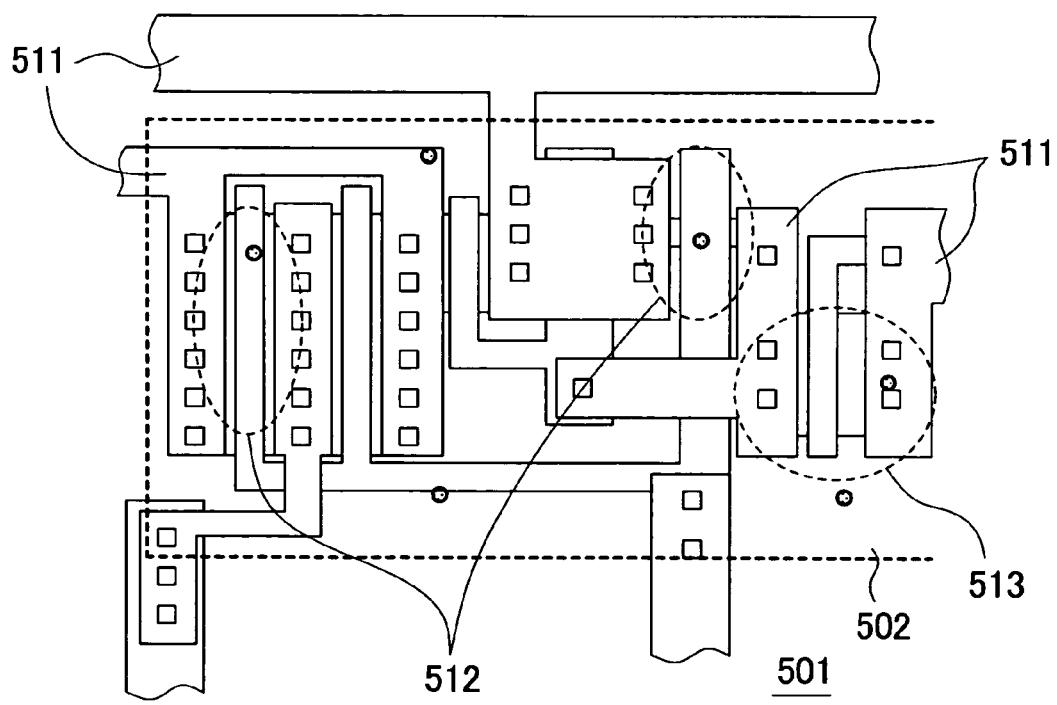
FIG. 22 is a partial plan view showing a state in which aluminum line 511 is formed.

FIG. 21 is a partial plan view showing a state in which a contact hole 510 is formed. Further, FIG. 22 is a partial plan view showing a state in which an aluminum line 511 is formed. A product in which the position where the aggregation is generated is overlapped to a gate portion (a channel region) of a thin film transistor TFT provides a defective transistor (1) 512 which exhibits a defective operation. Accordingly, this substrate is defective. The defective transistor (2) 513 which has the aggregations at portions other than the gate portions (channel regions) does not fundamentally exhibit the operational defect. However, when the aggregation is overlapped to the contact portion 510, the contact portion 510 becomes non-conductive and hence, the determination of good/defective product is made based on a balance between the position where the aggregation is generated and the size of the aggregation.

When the aggregation generating positions (the coordinates on the substrate) are recognized, by correlating the aggregation generating positions with the mask data, it is possible to classify the whole aggregations into the aggregations (1) 505 within the effective region, the aggregations (2) 506 outside the effective region, the aggregations (1-a) 508 at positions where the aggregations are overlapped to the gate electrodes 507, and the aggregations (1-b) 509 at positions where the aggregations are not overlapped to the gate electrodes 507. Also with respect to the aggregations (1-b) 509 at positions where the aggregations are not overlapped to the gate electrodes 507, by performing the calculation using two or more mask data (for example, taking AND), it is possible to classify the aggregations into the aggregations in the source region and the aggregations in the drain region, or it is possible to classify the aggregations into the aggregations which are arranged at positions of the contact holes or the aggregations which are not arranged at positions of the contact holes.

Accordingly, since the generation of the defective transistor (1) 512 and the defective transistor (2) 513 can be determined at a point of time of the completion of the aggregation inspection, once it is determined that the transistor is defective, it is possible to eliminate a probe inspection or a module step at the time of completion whereby a throughput of the inspection step can be shortened and the wasteful use of the module member can be reduced thus manufacturing the display device with high efficiency and at a low cost.

By setting the predetermined region used for the defective product determination to the channel region of the TFT, it is possible to determine the aggregation (1-a) 508 as a defective product. This can be calculated by taking AND between the mask data of patterning made of a poly-silicon film and mask data of patterning of gate electrodes.

By setting the predetermined region which is used for the determination of the defective product to the region where the contact hole is formed out of the source region and the drain region, it is possible to obviate the generation of the defective transistor (2) 513.

Further, although not shown in the drawing this time, in forming the capacitance using the poly-silicon film, when the aggregations are generated, the capacitance is changed. Accordingly, by setting the predetermined region which is used for the determination of the defective product to the region where the capacitance is formed, it is possible to obviate this drawback.

Further, since the aggregations (2) outside the effective region do not influence the build-in of the thin film transistor, it is possible to reform the defective substrate into the good substrate by taking the layout of the substrate of the display device to which the present invention is applied into consideration.

What is claimed is:

1. A manufacturing method of a display device comprising:
    a semiconductor film reforming step which reforms a semiconductor film into a second state in which the semiconductor film possesses elongated crystalline particles by radiating a laser beam to the semiconductor film in a first state;
    an aggregation detecting step which detects the aggregation of the semiconductor film which is generated in the semiconductor film reforming step; and
    a defect determination step which determines a product as a defective product when a position of the aggregation is present in the inside of the predetermined region and determines the product as a good product when the position of the aggregation is present outside the predetermined region.

2. A manufacturing method of a display device according to claim 1, wherein the predetermined region includes, in patterning the semiconductor film in the second state, a region where the semiconductor film in the second state remains.

3. A manufacturing method of a display device according to claim 1, wherein the predetermined region includes a region where a thin film transistor using the semiconductor film in the second state is formed.

4. A manufacturing method of a display device according to claim 1, wherein the predetermined region includes a region where a channel region of a thin film transistor which uses the semiconductor film in the second state is formed.

5. A manufacturing method of a display device according to claim 1, wherein the predetermined region includes, out of the source region and a drain region of a thin film transistor which uses the semiconductor film in the second state, the region in which a contact hole is formed.

6. A manufacturing method of a display device according to claim 1, wherein the predetermined region includes a region in which a capacitance using the semiconductor film in the second state is formed.

7. A manufacturing method of a display device according to claim 1, wherein the predetermined region is calculated based on data of 1 to a plurality of photo masks.

8. A manufacturing method of a display device according to claim 1, wherein the aggregation detecting step detects the presence of the aggregation based on a quantity of light which passes through the semiconductor film.

* * * * *